United States Patent
Mikhailov (10) Patent No.: US 7,027,228 B2
(45) Date of Patent: Apr. 11, 2006

(54) ARRANGEMENT AND APPARATUS FOR OPTICAL BEAM TRANSFORMATION

(75) Inventor: Aleksei Mikhailov, Dortmund (DE)

(73) Assignee: Hentze-Lissotschenko Patentverwaltungs GmbH & Co., KG, Gerstengrund (DE)

( * ) Notice: Subject to any disclaimer, the term of this patent is extended or adjusted under 35 U.S.C. 154(b) by 0 days.

(21) Appl. No.: 10/976,006

(22) Filed: Oct. 29, 2004

(65) Prior Publication Data
US 2005/0105189 A1    May 19, 2005

(30) Foreign Application Priority Data
Oct. 30, 2003    (EP) .................................. 03024780

(51) Int. Cl.
| | |
|---|---|
| G02B 27/10 | (2006.01) |
| G02B 27/30 | (2006.01) |
| H01S 3/08 | (2006.01) |
| H01S 3/091 | (2006.01) |
| F21K 27/00 | (2006.01) |

(52) U.S. Cl. .................... 359/623; 359/624; 359/622; 359/621; 359/619; 359/641; 372/92; 372/75; 372/69; 362/259; 362/268

(58) Field of Classification Search ................ 359/621, 359/622, 623, 624, 619, 630, 637, 455, 456; 372/49, 69, 70, 75, 92, 99; 362/17, 18, 259, 362/268, 333
See application file for complete search history.

(56) References Cited

U.S. PATENT DOCUMENTS

| | | | | |
|---|---|---|---|---|
| 4,293,892 | A | * | 10/1981 | Plummer ..................... 362/17 |
| 4,972,427 | A | * | 11/1990 | Streifer et al. ................ 372/92 |
| 5,513,201 | A | * | 4/1996 | Yamaguchi et al. .......... 372/75 |
| 5,936,774 | A | * | 8/1999 | Street ......................... 359/630 |
| 6,005,717 | A | * | 12/1999 | Neuberger et al. .......... 359/619 |
| 6,021,003 | A | * | 2/2000 | Katsuki et al. .............. 359/619 |
| 6,356,380 | B1 | * | 3/2002 | Whitney ...................... 359/321 |
| 6,384,981 | B1 | * | 5/2002 | Hauschild .................... 359/622 |
| 6,471,372 | B1 | * | 10/2002 | Lissotschenko et al. .... 362/268 |
| 6,771,686 | B1 | * | 8/2004 | Ullman et al. ................ 372/92 |
| 6,773,142 | B1 | * | 8/2004 | Rekow ........................ 362/259 |
| 6,853,490 | B1 | * | 2/2005 | Wang et al. ................. 359/621 |

FOREIGN PATENT DOCUMENTS

| | | |
|---|---|---|
| DE | 101 13 019 | 9/2002 |
| EP | 1 006 382 | 6/2000 |
| EP | 1 176 450 | 1/2002 |

* cited by examiner

*Primary Examiner*—Loha Ben
(74) *Attorney, Agent, or Firm*—Hoffman, Wasson & Gitler (57) ABSTRACT

An arrangement for optical beam transformation, having at least one light source which can emit at least one light beam, with the at least one light beam having a greater divergence in a first direction (Y) than in a second direction (X) at right angles to it, a collimation means, which can at least reduce the divergence of the at least one light beam in the first direction (Y), an apparatus for optical beam transformation, which is arranged downstream from the collimation means in the propagation direction (Z) of the at least one light beam, with the apparatus being such that the divergence of the at least one light beam passing through the apparatus in the first direction (Y) is interchanged with the divergence in the second direction (X) at right angles to it, and such that the cross-sectional area of the at least one light beam is reduced in the apparatus for optical beam transformation.

17 Claims, 7 Drawing Sheets

ARRANGEMENT AND APPARATUS FOR OPTICAL BEAM TRANSFORMATION

BACKGROUND OF THE INVENTION

The present invention relates to an arrangement for optical beam transformation, including at least one light source which can emit at least one light beam, with the at least one light beam having a greater divergence in a first direction than in a second direction at right angles to it, a collimation means, which can at least reduce the divergence of the at least one light beam in the first direction, an apparatus for optical beam transformation, which is arranged downstream from the collimation means in the propagation direction of the at least one light beam, with the apparatus being designed such that the divergence of the at least one light beam passing through the apparatus in the first direction is interchanged with the divergence in the second direction at right angles to it. The present invention also relates to an apparatus for optical beam transformation, having at least one inlet surface and at least one outlet surface, with the apparatus being designed such that the divergence of a light beam passing through the apparatus in the first direction is interchanged with the divergence in the second direction which is at right angles to it.

An arrangement as well as an apparatus of the type mentioned above are known from European Patent Application EP 1 006 382 A1. The apparatus described in this document has, for example, a substrate composed of a transparent material which has an inlet surface and an outlet surface. Both the inlet surface and the outlet surface are designed to be essentially rectangular and elongated. The longitudinal extent of the inlet surface and of the outlet surface corresponds essentially to the second direction. If a laser diode bar is used as the light source, this second direction corresponds to the direction in which individual emitters in the laser diode bar are arranged alongside one another and at a distance from one another. This direction of reduced divergence is referred to as the slow axis. The first direction, at right angles to it, is the direction of greater divergence, which in the case of semiconductor laser diode bars is referred to as the fast axis.

In the apparatus, which is known from the abovementioned art, two or more cylindrical lenses are provided both on the inlet surface and on the outlet surface, and their cylinder axes are all aligned parallel to one another. The cylinder axes of the cylindrical lenses on the inlet surface and on the outlet surface each include an angle of 45° or −45° both with the slow axis and the fast axis. A light beam which emerges from an emitting section of a laser diode bar and which in the end extends in the form of a line in the slow axis direction is rotated through 90° as it passes through the apparatus for optical beam transformation that is known from the prior art, so that the light beam is in the form of a line in the fast axis direction after passing through the apparatus. An apparatus such as this offers the advantage that the rotation of the individual light beams makes it harder for the individual light beams to overlap in the slow axis direction.

With this apparatus, which is known from the art, it has found to be disadvantageous that the cross section of the beam is enlarged overall as it passes through the apparatus, because the cylindrical lenses, which are all parallel to one another, influence the beam only in a direction at right angles to the propagation direction while, in contrast, the direction which is at right angles to this first direction is not influenced at all by the apparatus or by the cylindrical lenses in the apparatus. The beam therefore diverges in this direction, so that the individual beam elements which have passed through the apparatus can be focused only with comparative difficulty at a common focus point after having passed through the apparatus. This is due, inter alia, to the fact that an image of the individual emitters of the light source (which is, by way of example, in the form of a laser diode bar) is created downstream from the device in a direction which is at right angles to the propagation direction while, in contrast, this is not the case for the other direction, which is at right angles to the propagation direction and to the abovementioned direction. Furthermore, the widening of the beam while passing through the apparatus can lead to the individual beam elements at least partially overlapping so that this reason on its own is sufficient to prevent clear focusing of all the beam elements on a common focus area.

The problem on which the present invention is based is to create an arrangement and an apparatus of the type mentioned initially which allow a light beam to be focused better after passing through the apparatus.

SUMMARY OF THE INVENTION

Provided is an apparatus for optical beam transformation designed such that the cross-sectional area of the at least one light beam is reduced in the apparatus for optical beam transformation. Reducing the size of the at least one light beam in the apparatus effectively makes it possible to prevent two or more light beams passing through the apparatus from overlapping one another while passing through the apparatus, or shortly afterwards. The reduction in size may, for example, be of equal magnitude, in particular corresponding approximately to a factor of two, in two directions which are at right angles to one another and are at right angles to the propagation direction.

Further provided is an apparatus for optical beam transformation designed such that it can produce an image of the at least one light beam to be transformed by it with respect to two directions, which are at right angles to one another and to the propagation direction of the light beam, on a plane. The production of an image for two mutually perpendicular directions on a plane considerably improves the capability to focus the light beam in these two mutually perpendicular directions. In particular, a beam such as this can be focused without any additional imaging errors.

It is further provided for that the plane, on which the image of the light beam to be transformed, can be produced to be a plane at right angles to the propagation direction.

It is provided for the arrangement to include collimation means and/or focusing means for collimation and/or focusing of the at least one light beam downstream from the apparatus for optical beam transformation, in the propagation direction of the at least one light beam.

Furthermore, it is provided for that the at least one light source to be in the form of a semiconductor laser apparatus, in particular a semiconductor laser diode bar.

It is also provided for that two or more cylindrical lenses to be arranged on the at least one inlet surface and/or on the at least one outlet surface of the apparatus.

In this case, it is provided for that the cylindrical lenses to include an angle of +45° and/or −45° with the second direction.

Furthermore, in this case, it is provided for that the at least one inlet surface and/or the at least one outlet surface of the apparatus to have an essentially elongated, preferably rectangular shape, with the longitudinal direction of the inlet surface and/or outlet surface corresponding essentially to the second direction.

According to the invention, it is provided for that the apparatus to comprise two parts, which each have an inlet surface and an outlet surface.

In this case, it is provided for that two or more cylindrical lenses to be arranged on each of the inlet and outlet surfaces of the parts.

According to the invention, it is provided for that the cylindrical lenses on two surfaces of the parts to be aligned at right angles to the cylindrical lenses on two other surfaces of the parts. The alignment of cylindrical lenses on some of the surfaces at right angles to the cylindrical lenses on others of the surfaces makes it possible to ensure that the at least one light beam passing through the apparatus is influenced by the apparatus in two mutually perpendicular directions.

It is also provided for that at least one of the inlet and/or outlet surfaces of the apparatus to be provided with two or more concave cylindrical lenses. In particular, the combination of concave and convex cylindrical lenses, which may in this case be arranged one behind the other, makes it possible to ensure that an image for the two mutually perpendicular directions can be produced on one and the same plane.

It is further provided for that the focal lengths of the cylindrical lenses on their inlet and/or outlet surfaces to be different for at least one of the parts. Different focal lengths of cylindrical lenses which are arranged one behind the other makes it possible, for example, to reduce the cross section of the light beam, for example for a telescope arrangement. Ultimately, a telescope arrangement can be achieved by the distance between the cylindrical lenses on the inlet surface and the outlet surface of the respective part corresponding to the sum of the focal lengths of these cylindrical lenses.

It is in this case provided for that the focal lengths of the cylindrical lenses of at least one of the parts to be an integer multiple of the focal length of the respective other cylindrical lenses of the corresponding part. Such choice of the focal lengths makes it possible to achieve an integer reduction in the size of the at least one light beam passing through the apparatus.

BRIEF DESCRIPTION OF THE DRAWINGS

Further features and advantages of the present invention will become clear from the following description of preferred exemplary embodiments, with reference to the attached figures, in which:

FIG. 1b shows a plan view of the arrangement shown in FIG. 1a;

FIG. 4a shows an example of a beam path through the apparatus according to the invention, on the plane illustrated in FIG. 3a;

DETAILED DESCRIPTION OF THE INVENTION

In order to assist orientation, Cartesian coordinate systems are used in FIG. 1a to FIG. 7.

Figure 1A:
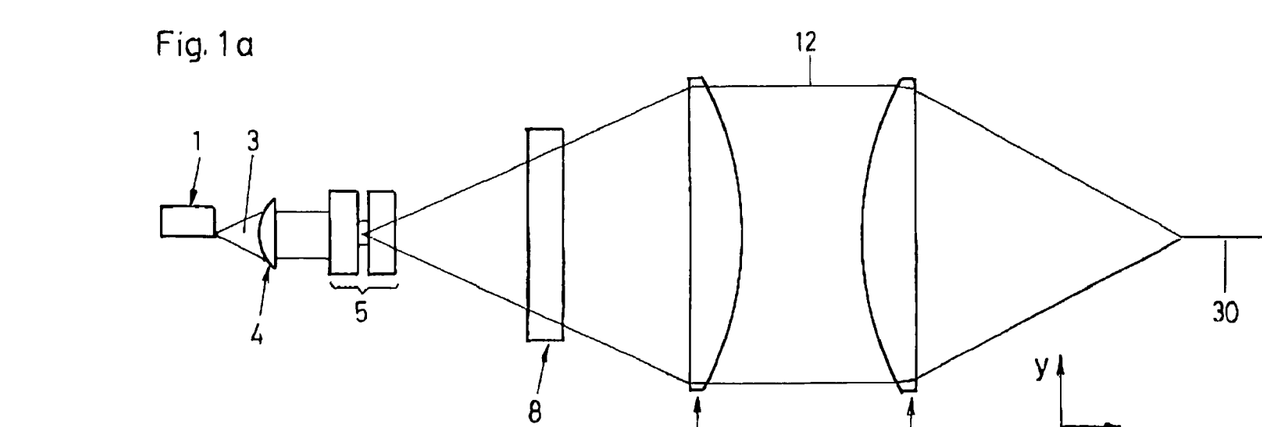
FIG. 1a shows a side view of an arrangement according to the invention for optical beam transformation.
Figure 1B:
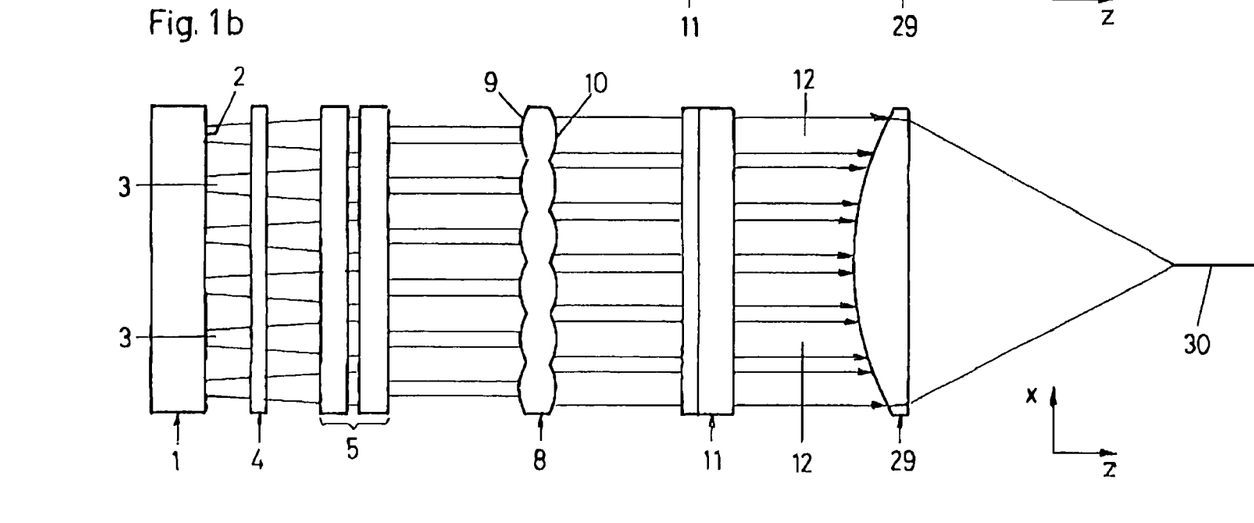

An embodiment of an arrangement, according to the inventions which can be seen in FIG. 1a and FIG. 1b includes a light source 1 in the form of laser diode bars having emitting sections which are arranged alongside one another in the X direction and are separated from one another in the X direction. The light beams which originate from the individual emitting sections 2 have considerably greater divergence in a first direction, which corresponds to the Y direction, than in a second direction, which corresponds to the X direction. It is generally normal to refer to the direction of greater divergence as the fast axis, and to the direction of lesser divergence as the slow axis.

The illustrated arrangement has a collimation means 4, in the form of a fast axis collimation lens, downstream from the emitting sections 2 in the propagation direction Z. This collimation means 4 may be a plano-convex cylindrical lens, whose cylinder axis extends in the X direction. In particular, this cylindrical lens may have a very short focal length, and may be arranged very close to the emitting sections 2.

An apparatus 5, according to the invention, for optical beam transformation is arranged downstream from the collimation means 4 in the propagation direction Z. In the illustrated exemplary embodiment, the apparatus 5 comprises two separate parts 6, 7, which are arranged one behind the other in the propagation direction Z and each have an inlet surface and an outlet surface. The apparatus 5 will be described in more detail in the following text with reference to FIG. 2 to FIG. 5.

Each of the light beams 3 is transformed in the apparatus 5 such that its cross section is reduced, and such that the divergence in the X direction is interchanged with the divergence in the Y direction at the same time. In particular, this results in the distance between the individual light beams 3 in the X direction becoming considerably greater. This therefore results in areas which are not filled with light between the individual light beams 3. In order to allow all of the light beams 3 to be focused better, for example at a point, a lens array 8 is provided downstream from the apparatus 5 in the propagation direction Z and may have lenses 9, 10 both on the inlet surface and on the outlet surface. The lenses 9, 10 are cylindrical lenses, whose cylinder axes extend in the Y direction. This lens array 8 widens the individual light beams, so that the distance between the individual light beams in the X direction is considerably less.

A collimating lens 11 which, by way of example, is in the form of a cylindrical lens whose cylinder axis extends in the X direction, may be provided downstream from the lens array 8 in the propagation direction Z. FIG. 1a and FIG. 1b clearly show that the individual light beams 12 have no divergence, or only diffraction-limited divergence in the X direction, and thus on the original slow axis, after passing through the apparatus 5 while, in contrast, the individual light beams 12 diverge in the Y direction, and thus in the original fast axis direction, with this divergence corresponding to the original divergence in the slow axis direction before passing through the apparatus 5. The divergences in the slow axis and fast axis directions are therefore interchanged on passing through the apparatus 5. The residual convergence in the fast axis direction can thus be collimated by means of the collimating lens 11. The light beams 12 which emerge from the collimating lens 11 thus essentially represent parallel light, which can be focused very easily.

As can be seen from FIG. 1a and FIG. 1b, the light beams 12 have substantially the same extent in both the X direction and the Y direction. The light beams 12 could thus be focused very effectively on the inlet surface of a glass fiber 30 by means of a focusing lens 29 arranged downstream from the collimating lens 11 in the positive Z direction.

Figure 2:
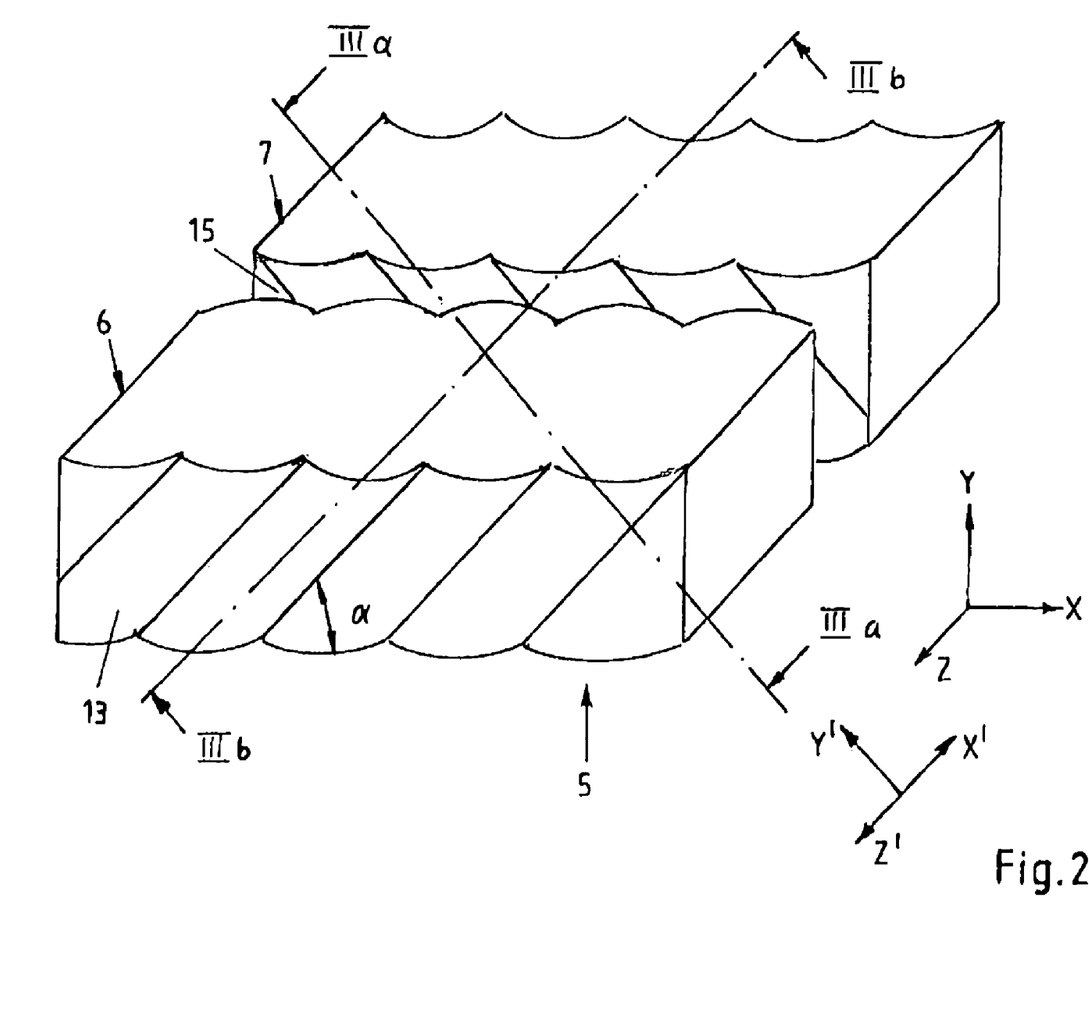
FIG. 2 shows a perspective view of an apparatus according to the invention for optical beam transformation.

As can be seen, for example, from FIG. 2, the apparatus 5 for optical beam transformation comprises a first part 6 and a second part 7. On its inlet surface, the part 6 has a large number of cylindrical lenses 3, whose cylinder axes are inclined at an angle of $\alpha=45°$ to the X axis. Only six cylindrical lenses 13 are shown in the illustrated exemplary embodiment. However, it is perfectly possible to provide considerably more cylindrical lenses 13 on the inlet surface. To this extent, FIG. 2 represents only a simplified illustration.

Figure 3A:
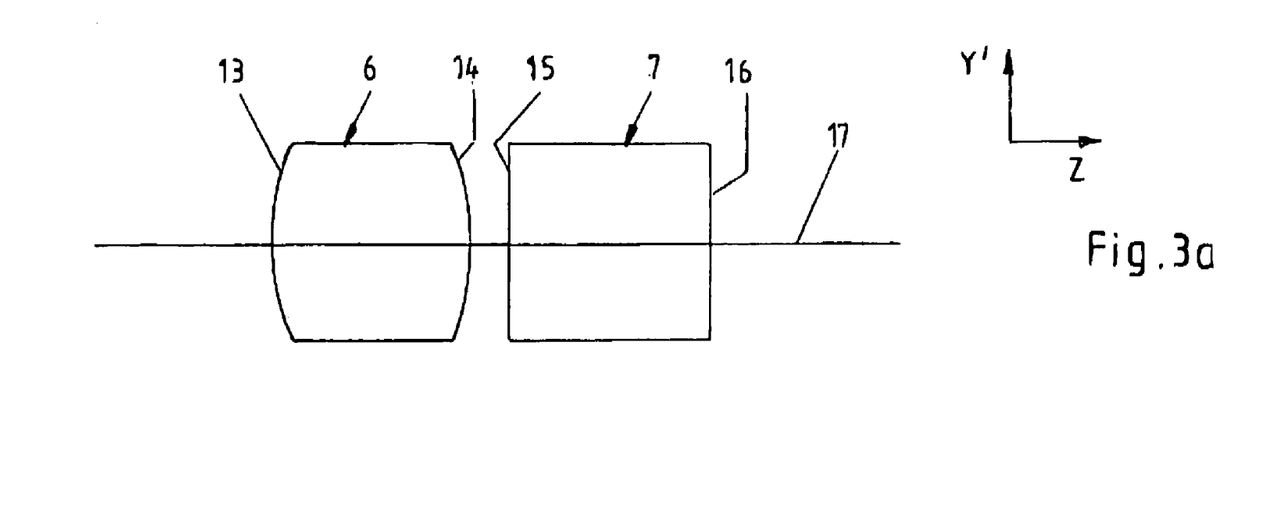
FIG. 3a shows a detail of a section along the arrows IIIa—IIIa in FIG. 2.
Figure 3B:
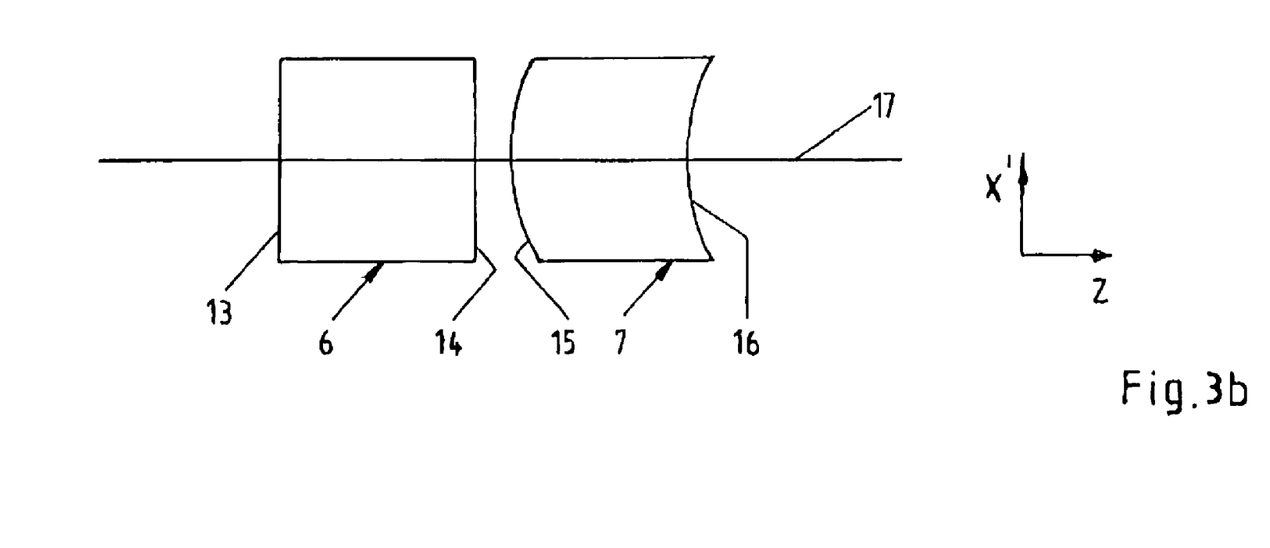
FIG. 3b shows a detail of a section along the arrows IIIb—IIIb in FIG. 2.

A large number of cylindrical lenses 14 are likewise arranged on the outlet surface of the part 6, and their cylindrical lenses are likewise inclined at an angle of $\alpha=45°$ to the X axis. This can be seen even more clearly in FIG. 3a, from which it can be seen that both the cylindrical lenses 13 and the cylindrical lenses 14 are convex. FIG. 3a shows a detail of a section along the Y' direction, which is shown in FIG. 2. In contrast, FIG. 3b shows a view rotated through 90°, once again in detail from a section along the X' direction, which can likewise be seen in FIG. 2. The cylinder axes of the cylindrical lenses 13, 14 extend in a corresponding manner in the X' direction.

On its inlet surface, the second part 7 of the apparatus 5 likewise has convex cylindrical lenses 15. The cylinder axes of these cylindrical lenses 15 extend, however, at an angle of 135° to the X direction, and thus along the Y' direction.

On its outlet surface, the part 7 has concave cylindrical lenses 16, whose cylinder axes, which are likewise arranged parallel to one another, likewise include an angle of 135° with the X direction, and therefore likewise extend in the Y' direction.

Figure 4A:
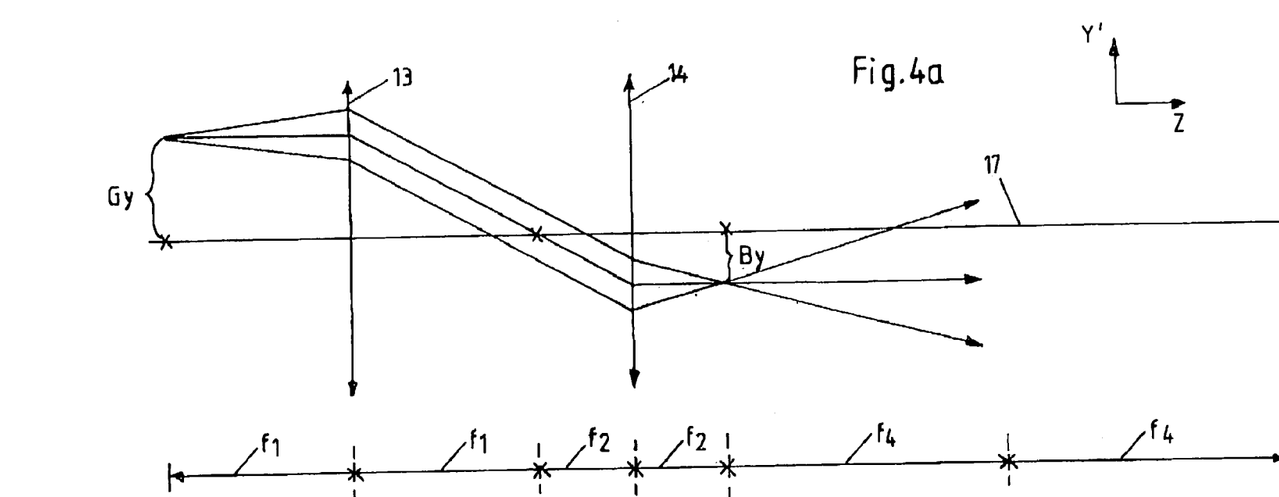
Figure 4B:
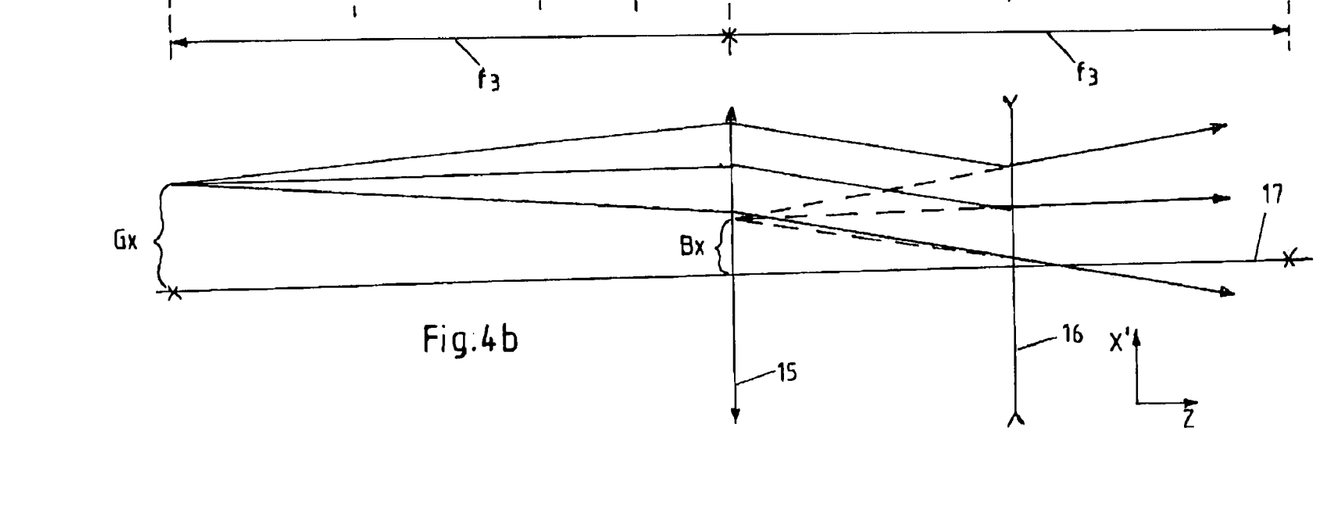
FIG. 4b shows an example of a beam path through the apparatus, on the plane illustrated in FIG. 3b.

The focal lengths of the individual cylindrical lenses 13, 14, 15, 16 can be seen in FIGS. 4a and 4b. In particular $f_1$ denotes the focal length of the first cylindrical lens 13. The focal length of the second cylindrical lens 14 is denoted $f_2$, where $f_1=2*f_2$. $f_3$ denotes the focal length of the third cylindrical lens 15, where $f_3=2*f_1+2*f_2$. $f_4$ denotes the focal length of the fourth cylindrical lens 16, where $f_3=2*f_4$.

In particular, the parts 6, 7 are in this case arranged in such a way the distance between the second cylindrical lens 14, which is arranged on the outlet surface of the part 6, and the third cylindrical lens 15, which is arranged on the inlet surface of the part 7, corresponds to the focal length $f_2$ of the second cylindrical lens 14.

The optical distance between the first cylindrical lenses 13 and the second cylindrical lenses 14 in the Z direction corresponds to the sum of the two focal lengths $f_1$, $f_2$ of the cylindrical lenses 13, 14. This can clearly be seen from FIG. 4a. The optical distance between the third cylindrical lenses 15 and the fourth cylindrical lenses 16 in the Z direction corresponds to the focal length $f_4$ of the fourth cylindrical lenses 16. This can clearly be seen from FIG. 4b.

FIG. 4a and FIG. 4b show the imaging behavior of the apparatus 5 in detail. In particular, the cylindrical lenses 13, 14, 15, 16 are indicated schematically, by lines provided with arrows, in FIG. 4a and the FIG. 4b. The focal lengths of the individual lenses are indicated by crosses on the optical axis, which is annotated with the reference symbol 17, of the respect lens system. The positions of the individual focal lengths $f_1$, $f_2$, $f_3$, $f_4$ are additionally indicated between FIG. 4a and FIG. 4b.

At this point, it should be noted that the first cylindrical lenses 13 and the second cylindrical lenses 14 have no influence on the distances between the light beams in the X' direction and the optical axis, because their cylinder axes are aligned in the X' direction. The cylindrical lenses 13, 14 in the first part 6 of the apparatus 5 are therefore not shown in FIG. 4b. Analogously, the third cylindrical lenses 15 and the fourth cylindrical lenses 16 in the second part 7 have no influence on the light beams which are shown in FIG. 4a and are at a distance from the optical axis in the Y' direction, because their cylinder axes are aligned in the Y' direction, so that the cylindrical lenses 15, 16 in the second part 7 are not shown in FIG. 4a. The cylindrical lenses 13, 14 in the first part 6 therefore act as lenses only with regard to the Y' direction while, in contrast, they have no influence on the light beams passing through them with regard to the X' direction. In a corresponding manner, the cylindrical lenses 15, 16 in the second part 7 act on the light beams passing through them only with respect to the X' direction while, in contrast, they have no influence on the light beams passing through them with respect to the Y' direction.

As can be seen from FIG. 4a, a point which is separated by a distance $G_y$ from the optical axis 17 in the Y' direction and is at a distance which corresponds to the focal length $f_1$ of the first cylindrical lens 13 away from the first cylindrical lens 13 in the Z direction is imaged by the imaging system formed by the cylindrical lenses 13, 14 at a point which is at a distance $B_y$ from the optical axis 17 in the Y' direction. This image point $B_y$ is in this case located downstream from the cylindrical lens 14 in the Z direction, at a distance which corresponds to the focal length $f_2$ of the second cylindrical lens 14.

FIG. 4b shows the image of the point at a distance of $G_x$ from the optical axis 17 in the X' direction produced by the imaging system formed by the third and fourth cylindrical lenses 15, 16. Since the fourth cylindrical lenses 16 are divergent lenses, the abovementioned imaging system which is shown in FIG. 4b results in an image which produces a virtual image located exactly at the same point at which the third cylindrical lenses 15 are located, in the Z direction, in the illustrated exemplary embodiment. The distance $B_x$ between this virtual image and the optical axis in the X' direction is half as great as the distance $G_x$. The imaging system which is formed by the third and fourth cylindrical lenses 15, 16 thus reduces the cross section of a light beam passing through the imaging system by a factor of 2. As can also be seen from FIG. 4b, the virtual image is arranged on the same side of the optical axis 17 in the X' direction, so that it is possible to speak of an image for which M=+½.

In contrast, the imaging system which is formed by the first and second cylindrical lenses 13 and 14 produces a smaller image on the opposite side of the optical axis 17. In particular, in this case as well, the distance $G_y$ is twice as great as the distance $B_y$, so that in this case it is possible to speak of an image for which M=–½.

The apparatus 5 according to the invention has the very major advantage that the images both of the imaging system illustrated in FIG. 4a and comprising the first and second cylindrical lenses 13, 14 and of the imaging system illustrated in FIG. 4b and formed from the third and fourth cylindrical lenses 15, 16 lie on the same X'-Y' plane, or X-Y plane, respectively and thus on the same plane with respect to the Z direction. With regard to the propagation direction Z, this thus results in an image at a point which can be predetermined, the characteristics of which image can be predetermined, both with respect to the X' direction and with respect to the Y' direction. This image can very easily be collimated or focused by downstream lens means.

Finally, in the case of an apparatus according to the invention, the critical factor is not the location at which the lenses 13, 14, 15, 16 are arranged but that the two images which are produced with respect to the X' direction and Y' direction lie on the same X'-Y' plane, or the same X-Y plane, respectively. By way of example, the image $B_x$ need not necessarily be produced exactly at the Z position at which the cylindrical lens 15 is also located. This image $B_x$ may be produced behind or in front of the cylindrical lens 15.

Furthermore, it is also perfectly possible for the two parts 6, 7 of the apparatus 5 to have cylindrical lenses, whose cylinder axes are at right angles to one another, on their inlet surface and their outlet surface. By way of example, a cylindrical lens such as the cylindrical lens 15 which acts only in the X' direction could thus be arranged at the outlet surface of the first part 6 while, in contrast, a cylindrical lens such as the cylindrical lens 14 which acts only on the Y' direction can be arranged on the inlet surface of the second part 7. All that is necessary is to ensure that the chosen focal lengths $f_1$, $f_2$, $f_3$, $f_4$ and the corresponding positions of the cylindrical lenses 13, 14, 15, 16 result in the images $B_x$, and $B_y$, which are produced with respect to the X' direction and the Y' direction, lying on the same plane at right angles to the Z direction.

Figure 5:
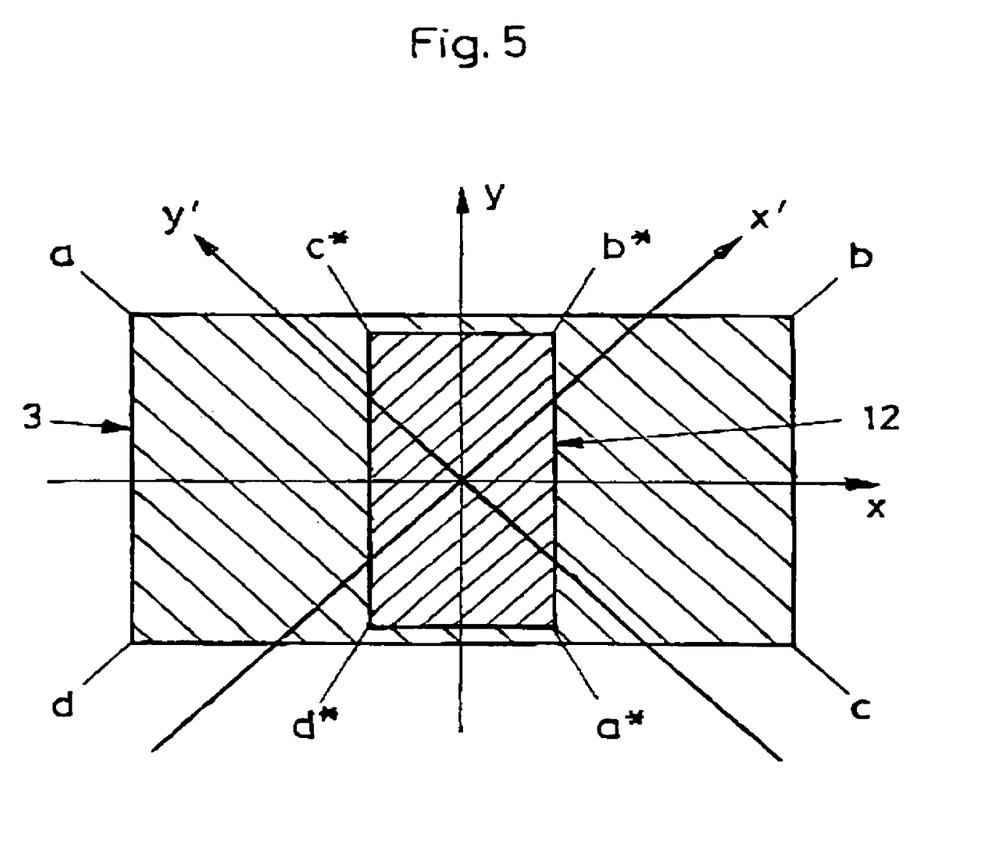
FIG. 5 shows the cross section of a light beam before and after passing through the apparatus shown in FIG. 2.

Once again in schematic form, FIG. 5 shows the cross section of a light beam 3 before passing through the apparatus 5, and the cross section of the light beam 12 that has passed through the apparatus 5. In particular, this clearly shows that the cross section of the light beam 3 has been approximately halved in both directions. FIG. 5 shows that the light beam 3 has an essentially rectangular cross section before passing through the apparatus 5. The corners of this rectangular cross section are annotated with the letters a, b, c, d.

The cross section of the light beam 12 which has passed through the apparatus 5 is likewise rectangular, with the corners of this rectangle being annotated with the letters a*, b*, d*, d*. As can be seen, the rectangle of the cross section of the light beam 3, which previously extended in the X direction, has been converted to a rectangle of the cross section of the light beam 12 which extends in the Y direction once it has passed through. The reduction in the size of the cross section is also clearly evident. The beam transformation carried out by the apparatus 5 results in the light beam 3 or the light beam 12 being rotated through 90° about the propagation direction Z, with subsequent mirroring on a plane which is parallel to the propagation direction Z and which passes through the Y direction. Finally, the beam transformation process which is carried out on the light beam 3 or the light beam 12 results in the divergences between the slow axis direction (X direction) and the fast axis direction (Y direction) being interchanged, in addition to the size of the cross section being reduced. In the case of the apparatuses for beam transformation which are known from the prior art, this is generally achieved by simple rotations through 90°.

Figure 6:
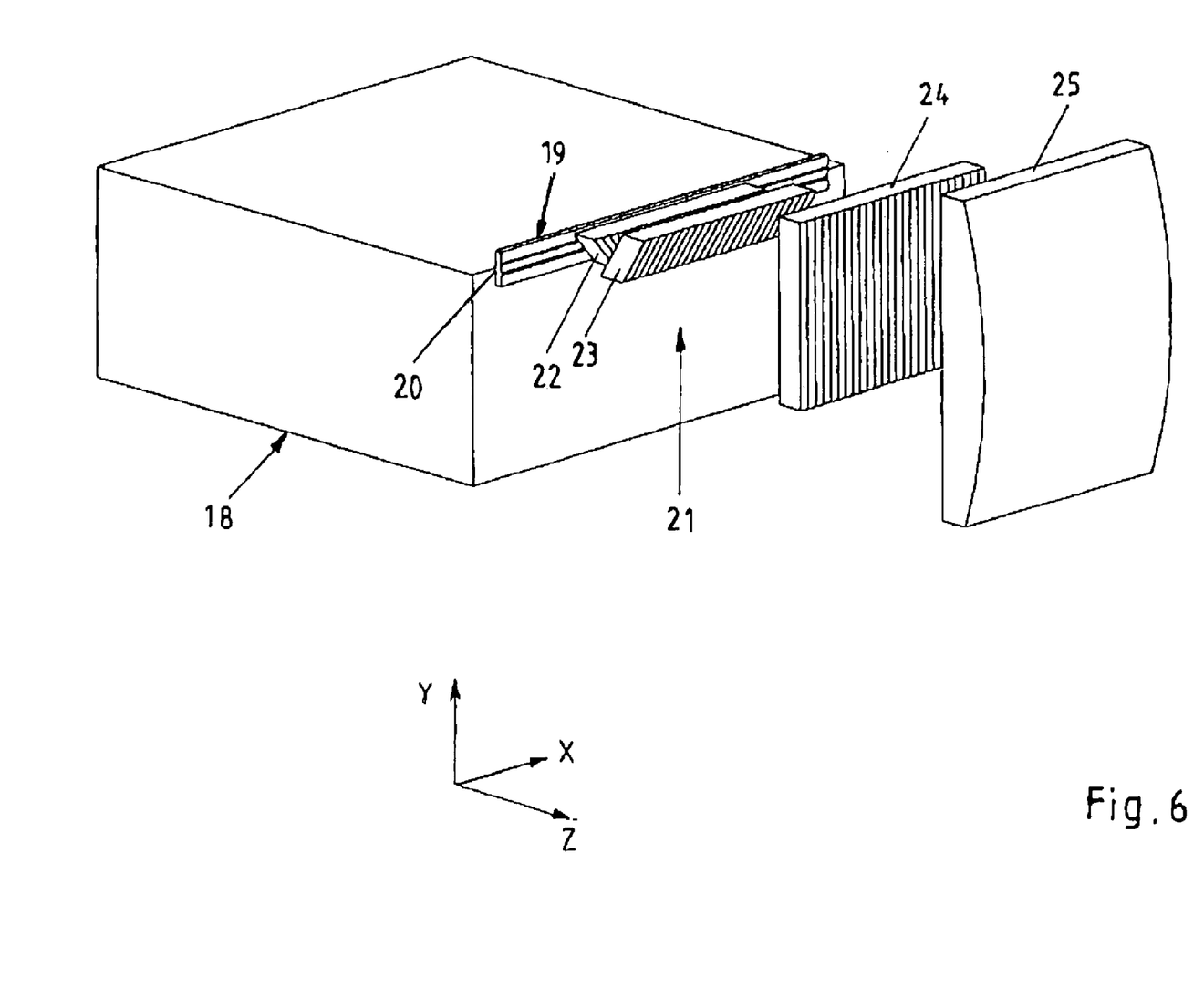
FIG. 6 shows a perspective view of a further embodiment of an arrangement according to the invention.
Figure 7:
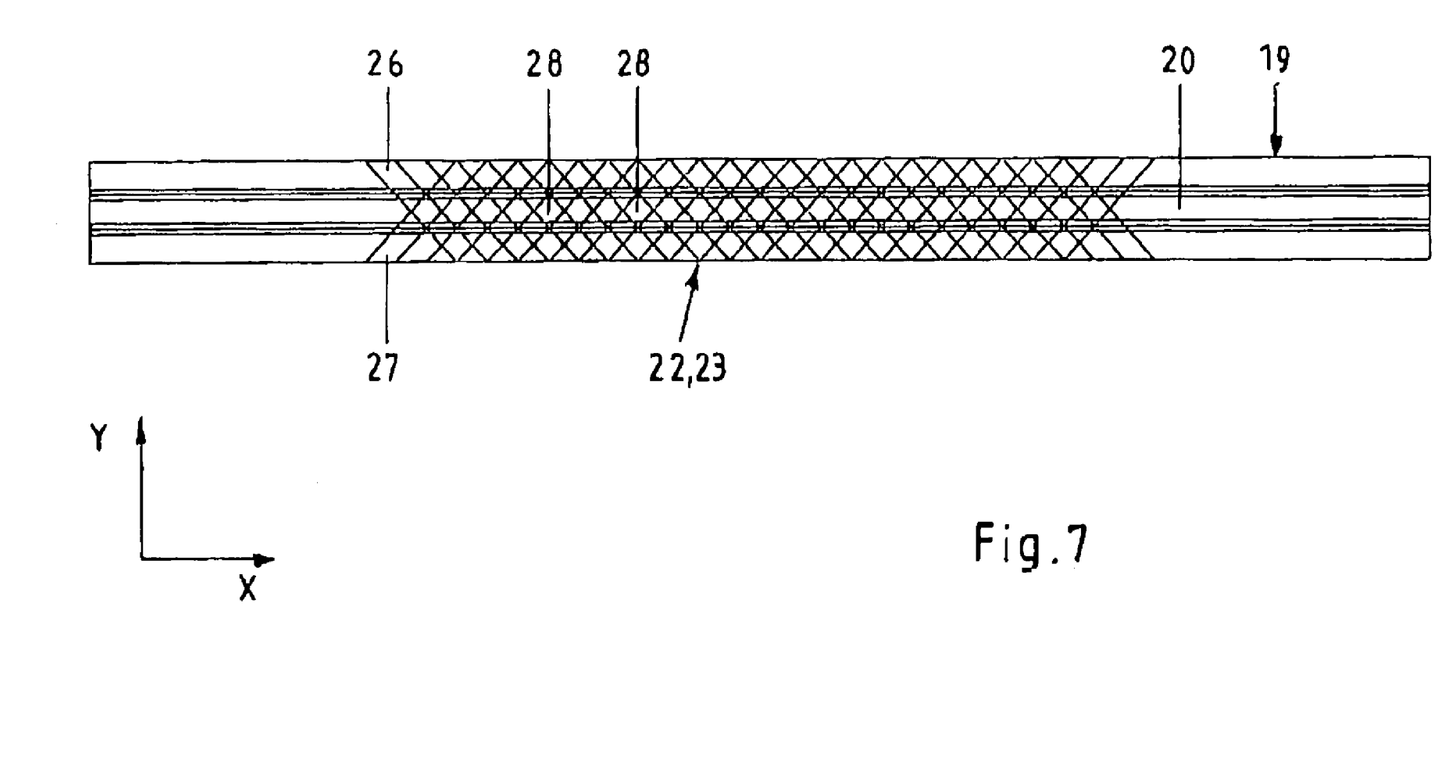
FIG. 7 shows a rear view of the apparatus for optical beam transformation as shown in FIG. 6, with the collimation means located behind it.

FIG. 6 shows a further embodiment of an arrangement according to the invention which, in principle, is physically very similar to the arrangement illustrated in FIG. 1a and FIG. 1b. In particular, in this case, the light source 18 is in the form of a semiconductor laser apparatus with a comparatively large heat sink. The actual semiconductor laser element is not shown in FIG. 6. Furthermore, the focusing lens 29 and the glass fiber 30 are not shown. Following the light source 18, a collimation means 19 can be seen, which is in the form of a glass substrate with a comparatively large extent and with a cylindrical lens 20 formed in it and used as a fast axis collimation lens.

This is followed in the beam direction, or the Z direction, by an apparatus 21 according to the invention for optical beam transformation. This apparatus likewise comprises two parts 22, 23 which, like the parts 6, 7 of the apparatus 5, have cylindrical lenses on the inlet surface and on the outlet surface which cylindrical lenses in principle correspond to the cylindrical lenses 13, 14, 15, 16 which can be seen clearly in FIG. 3a and FIG. 3b.

In the positive Z direction, this is followed by a lens array 24, which has cylindrical lenses only on its outlet surface.

This is followed in the positive Z direction by a collimating lens 25, which essentially corresponds to the collimating lens 11.

FIG. 7 once again shows the parts 22, 23 of the apparatus 21 together with the collimation means 19 in a view in the negative Z direction. In particular, this shows that the individual cylindrical lenses, of which the cylindrical lenses 26 on the outlet surface of the part 22 and the cylindrical lenses 27 on the outlet surface of the part 23 are provided with reference symbols, create essentially square apertures 28 which are aligned in the Z direction with the cylindrical lens 20 of the collimation means 19. The light from the semiconductor laser has to pass through these relatively small square apertures 28, so that the reduction in the size of the cross section of the light beam 3 on passing through the apparatus 21 or the apparatus 5 is worthwhile.

What is claimed is:

1. An arrangement for optical beam transformation, comprising:
   at least one light source which can emit at least one light beam, with the at least one light beam having a greater divergence in a first direction (Y) than in a second direction (X) at right angles to it;
   a collimation means, which can at least reduce the divergence of the at least one light beam in the first direction (Y);
   an apparatus for optical beam transformation, which is arranged downstream from the collimation means in the propagation direction (Z) of the at least one light beam, with the apparatus such that the divergence of the at least one light beam passing through the apparatus in the first direction (Y) is interchanged with the divergence in the second direction (X) at right angles to it;
   wherein the apparatus for optical beam transformation is such that the cross-sectional area of the at least one light beam is reduced in the apparatus for optical beam transformation.

2. The arrangement for optical beam transformation as claimed in claim 1, wherein the arrangement produces an image of the at least one light beam to be transformed by it with respect to two directions (X', Y'), which are at right angles to one another and to the propagation direction (Z) of the light beam, on a plane.

3. The arrangement as claimed in claim 2, wherein the plane on which the image of the light beam to be transformed can be produced is a plane at right angles to the propagation direction (Z).

4. The arrangement as claimed in claim 1, wherein the arrangement comprises collimation means and/or focusing means for collimation and/or focusing of the at least one light beam downstream from the apparatus for optical beam transformation, in the propagation direction (Z) of the at least one light beam.

5. The arrangement as claimed in claim 1, wherein the at least one light source is in the form of a semiconductor laser apparatus, in particular a semiconductor laser diode bar.

6. The apparatus for optical beam transformation for use in an arrangement as claimed in claim 1, comprising at least one inlet surface and at least one outlet surface, with the apparatus such that the divergence of a light beam passing through the apparatus in the first direction (Y) is interchanged with the divergence in the second direction (X) which is at right angles to it, wherein the apparatus for optical beam transformation is designed such that the cross-sectional area of the at least one light beam is reduced in the apparatus for optical beam transformation.

7. The apparatus as claimed in claim 6, wherein the apparatus for optical beam transformation is such that an image of the at least one light beam to be transformed by it can be produced with respect to two directions (X', Y'), which are at right angles to one another and to the propagation direction (Z) of the light beam, on a plane.

8. The apparatus as claimed in claim 7, wherein the plane on which the image of the light beam to be transformed can be produced is a plane at right angles to the propagation direction (Z).

9. The apparatus as claimed in claim 6, wherein two or more cylindrical lenses are arranged on the at least one inlet surface and/or on the at least one outlet surface of the apparatus.

10. The apparatus as claimed in claim 9, wherein the two or more cylindrical lenses include an angle ($\alpha$) of +45° and/or −45° with the second direction (X).

11. The apparatus as claimed in claim 9, wherein the at least one inlet surface and/or the at least one outlet surface of the apparatus has an essentially elongated, rectangular shape, with the longitudinal direction of the inlet surface and/or outlet surface corresponding essentially to the second direction (X).

12. The apparatus as claimed in claim 6, wherein the apparatus comprises two parts, which each have an inlet surface and an outlet surface.

13. The apparatus as claimed in claim 12, wherein two or more cylindrical lenses are arranged on each of the inlet and outlet surfaces of the parts.

14. The apparatus as claimed in claim 13, wherein the cylindrical lenses on two surfaces of the parts are aligned at right angles to the cylindrical lenses on two other surfaces of the parts.

15. The apparatus as claimed in claim 13, wherein focal lengths of the cylindrical lenses on their inlet and/or outlet surfaces are different for at least one of the parts.

16. The apparatus as claimed in claim 15, wherein the focal lengths of the cylindrical lenses of at least one of the parts are an integer multiple of the focal lengths ($f_1$, $f_2$, $f_3$, $f_4$) of the respective other cylindrical lenses of the corresponding part.

17. The apparatus as claimed in claim 6, wherein at least one of the inlet and outlet surfaces of the apparatus is provided with two or more concave cylindrical lenses.

* * * * *